US006509263B1

(12) United States Patent
Park et al.

(10) Patent No.: US 6,509,263 B1
(45) Date of Patent: Jan. 21, 2003

(54) METHOD FOR FABRICATING A SEMICONDUCTOR MEMORY DEVICE HAVING POLYSILICON WITH AN ENHANCED SURFACE CONCENTRATION AND REDUCED CONTACT RESISTANCE

(75) Inventors: Young-Hoon Park, Kyonggi-do (KR); Hyun-Ju Lee, Kyonggi-do (KR); Eun-Young Minn, Kyonggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/710,953

(22) Filed: Nov. 14, 2000

(30) Foreign Application Priority Data

Nov. 15, 1999 (KR) .............................. 99-50544

(51) Int. Cl.$^7$ ..................... H01L 21/8242; H01L 21/20; H01L 21/44
(52) U.S. Cl. ....................... 438/672; 438/396; 438/565; 438/660; 438/253
(58) Field of Search ................................. 438/253, 396, 438/565, 660, 672, 906, FOR 325, FOR 212, FOR 220, FOR 351

(56) References Cited

U.S. PATENT DOCUMENTS 5,959,326 A * 9/1999 Aiso et al.
6,187,659 B1 * 2/2001 Ying et al.

* cited by examiner

*Primary Examiner*—Wael Fahmy
*Assistant Examiner*—Thanh Pham
(74) *Attorney, Agent, or Firm*—Lee & Sterba, P.C.

(57) ABSTRACT

A method for fabricating a semiconductor device to reduce the contact resistance by enhancing the surface concentration of doped polysilicon in a semiconductor substrate divided into active and field regions, comprises the steps of forming a plurality of word lines each having a cap insulating layer with a predetermined interval between adjacent word lines on the substrate, forming source/drain impurity regions in the active regions adjacent to both sides of each of the word lines, forming insulating sidewalls on both sides of each of the word lines, forming capacitor node plugs and bit line contact plugs on the source/drain impurity regions, forming a plurality of bit lines in the direction perpendicular to the word lines with a predetermined interval between adjacent bit lines by forming bit line contact holes contacting the bit line contact plugs in a first insulating interlayer deposited on the substrate, forming storage electrode contact holes to expose the capacitor node plugs in a second insulating interlayer deposited over the substrate, and subjecting the storage electrode contact holes to heat treatment before implanting impurity ions through the storage electrode contact holes into the active regions to grow the storage electrodes.

13 Claims, 17 Drawing Sheets

METHOD FOR FABRICATING A SEMICONDUCTOR MEMORY DEVICE HAVING POLYSILICON WITH AN ENHANCED SURFACE CONCENTRATION AND REDUCED CONTACT RESISTANCE

BACKGROUND OF THE INVENTION

1. Field of the Invention

The present invention relates to a semiconductor memory device, and more particularly, to a method for fabricating a semiconductor memory device with a reduced contact resistance.

2. Description of the Related Art

Generally, DRAM is fabricated by using MOS technology to include a number of memory cells each consisting of one transistor and one capacitor, providing large capacity at low power consumption and low cost. Its storage is accomplished by charging the capacitors with binary high or low values, which is different from a SRAM (Static Random Access Memory) storing information in flip-flops. The DRAM requires refresh cycles for recharging the memory cells since the capacitors are discharged after a certain amount of time. Hence, each memory cell requires a refresh period of between 2 nS to 10 nS. As the scale of integration of semiconductor devices increases, a 1G DRAM is expected to store 1-gigabit of information in one chip, whose unit cell has a size of about 0.3 $\mu m^2$.

FIGS. 1A to 1E are layouts for illustrating a general method for fabricating a semiconductor device, and FIGS. 2A to 2F are cross-sectional views taken along line I–I' of FIGS. 1A to 1E for illustrating a conventional method for fabricating a semiconductor device.

Referring to FIG. 1A and 2A, a semiconductor substrate 1 is divided into active regions 2 and field regions. The field region is provided with the field oxide layer 3. A plurality of word lines 4 with the cap-insulating layers 5 are laid perpendicular to and over the active regions 2 with a predetermined interval between them. The active regions 2 are selectively implanted with impurity ions of low concentration by using the word lines 4 as a mask, forming LDD impurity regions. In this case, each active region is crossed by two word lines 4. Both sides of each word line 4 are covered with insulating sidewalls 6, which serve as the mask to implant impurity ions of high concentration into the active regions to form source/drain regions.

Referring to FIGS. 1B and 2B, a first polysilicon layer is deposited over the semiconductor substrate 1. The first polysilicon layer is patterned by photolithographic process to expose the cap insulating layer 5 and to form a plurality of plugs 7a, 7b over the active regions 2 between the word lines 4. The plug 7b is extended to the region to form the bit line for two cells to commonly occupy a single contact, as shown in FIG. 1B. In addition, a first interlayer dielectric (WLD) 8 is heavily deposited over the plugs 7a, 7b, and flattened.

Referring to FIGS. 1C and 2C, after forming a bit line contact hole in the plug 7b extended to the bit line, tungsten and cap insulating layers are deposited over the substrate including the bit line contact hole, patterned by photolithographic process to form bit line 9 and cap insulating layer (not shown in the drawing) in the direction perpendicular to the word line 4. Then, a second insulating interlayer 10 is formed over the substrate including the bit line 9, and then flattened or planarized.

Subsequently, a photoresist (not shown in the drawing) is deposited over the second insulating interlayer 10, photographically patterned to form first contact holes 11 by etching the second insulating interlayer 10, bit lines 9, and first insulating interlayer 8, as shown in FIGS. 1D and 2D. Then, impurity ions are implanted through the first contact holes 11 into the surface of the first polysilicon layer, as shown in FIGS. 1E and 2E. Finally, deposited over the second insulating interlayer 10 including the first contact holes 11 is a second polysilicon layer, selectively patterned to form the storage electrodes 12 held by the second insulating interlayer 10 over the active regions 2, as shown in FIG. 2F. In this case, the concentration of the second polysilicon is equal to or greater than $1E21/cm^3$.

However, such conventional method for fabricating a semiconductor device suffers the following problems:

As the size of the device is reduced, the contact resistance of doped polysilicon to doped polysilicon is considerably increased compared to metal to silicon, metal to metal, and metal to doped polysilicon. If the contact resistance is reduced by enhancing the concentration of the polysilicon over $1E21/cm^3$, the subsequent heat treatment results in diffusion of the impurities causing refreshment. Moreover, if the surface concentration of the polysilicon is enhanced by plug ion implantation, an additional process is required which results in the formation of a spontaneous oxide layer on the polysilicon surface due to the process delay. This results in an increase of the contact resistance, such that there is a generation of a RC delay of the semiconductor device, which prevents high speed.

SUMMARY OF THE INVENTION

It is a feature of the present invention to provide a method for fabricating a semiconductor device that reduces the contact resistance by enhancing the surface concentration of the polysilicon without any additional process.

According to an aspect of the present invention, a method for fabricating a semiconductor device in a semiconductor substrate divided into active and field regions, comprises the steps of forming a plurality of word lines each having a cap insulating layer with a predetermined interval between adjacent word lines on the substrate, forming source/drain impurity regions in the active regions adjacent to both sides of each of the word lines, forming insulating sidewalls on both sides of each of the word lines, forming capacitor node plugs and bit line contact plugs on the source/drain impurity regions, forming a plurality of bit lines in the direction perpendicular to the word lines with a predetermined interval between adjacent bit lines by forming bit line contact holes contacting the bit line contact plugs in a first insulating interlayer deposited on the substrate, forming storage electrode contact holes to expose the capacitor node plugs in a second insulating interlayer deposited over the substrate, and subjecting the storage electrode contact holes to heat treatment before implanting impurity ions through the storage electrode contact holes into the active regions to grow the storage electrodes.

According to another aspect of the present invention, a method for fabricating a semiconductor device in a semiconductor substrate divided into active and field regions, the field regions being provided with field oxide layers, comprises the steps of forming a plurality of word lines each having a cap insulating layer with a predetermined interval between adjacent word lines on the substrate, forming source/drain impurity regions in the active regions adjacent to both sides of each of the word lines, forming insulating sidewalls on both sides of each of the word lines, forming capacitor node plugs and bit line contact plugs between the word lines and active regions after implanting impurity ions into a conductive layer deposited on the substrate including the word lines, forming a plurality of bit lines in a direction perpendicular to the word lines with a predetermined interval between adjacent bit lines by forming bit line contact holes contacting the bit line contact plugs in a first insulating interlayer deposited on the substrate, forming storage electrode contact holes to expose the capacitor node plugs in a second insulating interlayer deposited over the substrate, and subjecting the storage electrode contact holes to heat treatment before implanting impurity ions through the storage electrode contact holes into the active regions to grow the storage electrodes.

The present invention will now be described in more detail with reference to the drawings attached only by way of example.

BRIEF DESCRIPTION OF THE ATTACHED DRAWINGS

FIGS. 4A to 4E are cross sectional views that are similar to the cross-sectional views of FIGS. 3A–3E for illustrating a method for fabricating a semiconductor device according to another embodiment of the present invention; and FIGS. 5A to 5E are cross sectional views that are similar to the cross-sectional views of FIGS. 4A–4E for illustrating a method for fabricating a semiconductor device according to yet another embodiment of the present invention.

DETAILED DESCRIPTION OF THE PREFERRED EMBODIMENT

Korean Patent Application NO. 1999-50544, filed on Nov. 15, 1999, and entitled: "METHOD FOR FABRICATING A SEMICONDUCTOR DEVICE," is incorporated herein by reference in its entirety.

Figure 1A:
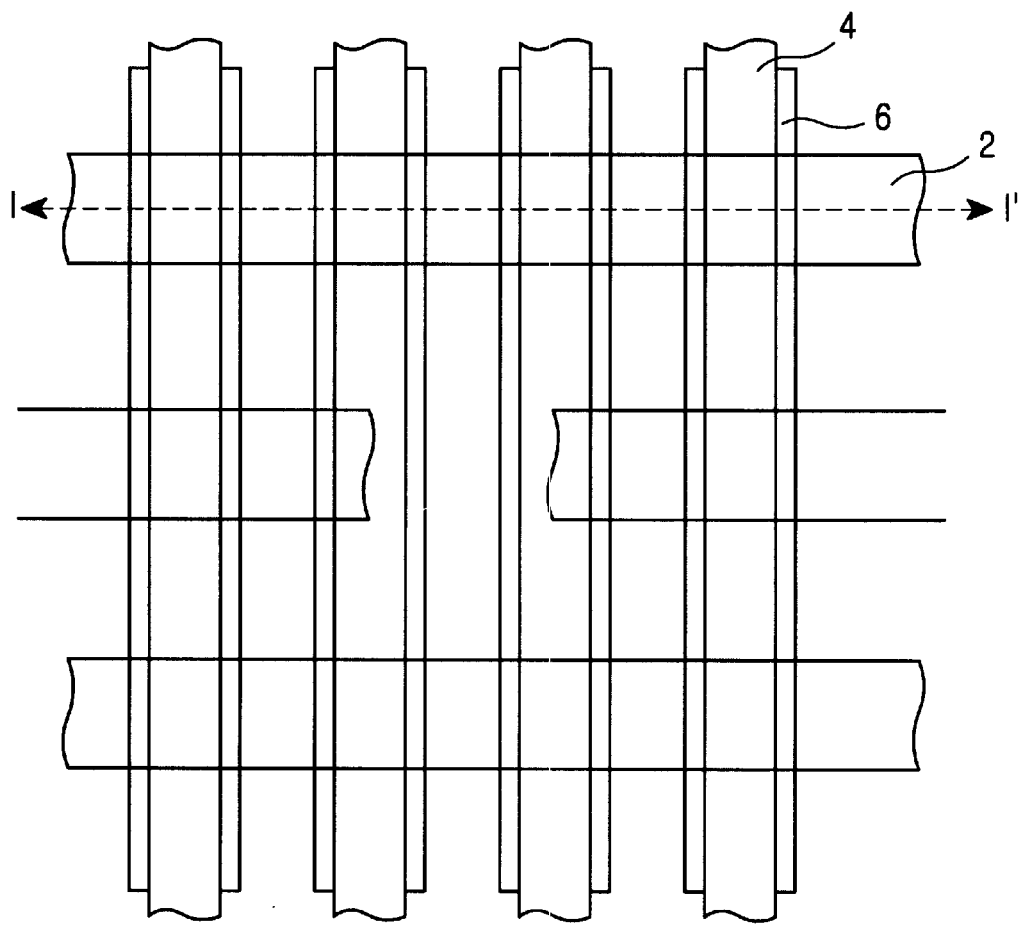
FIGS. 1A to 1E are layouts for illustrating a common method for fabricating a semiconductor device.

FIGS. 3A to 3E are cross sectional views taken along line I–I' of FIG. 1A for illustrating a method for fabricating a semiconductor device according to an embodiment of the present invention.

Figure 3A:
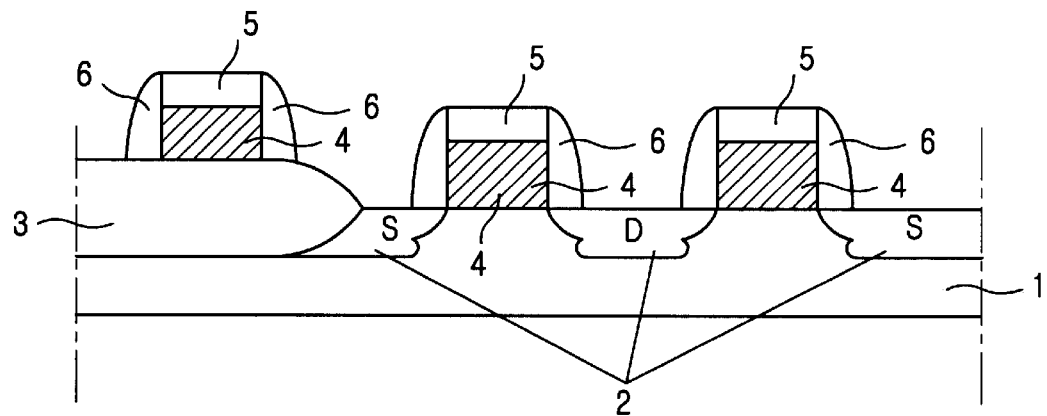
FIGS. 3A to 3E are cross sectional views that are similar to the cross-sectional views of FIGS. 2A–2F for illustrating a method for fabricating a semiconductor device according to an embodiment of the present invention.

Referring to FIGS. 1A and 3A, a semiconductor substrate 1 is divided into active regions 2 and field regions. The field region is provided with the field oxide layer 3. A plurality of word lines 4 with the cap-insulating layers 5 are laid perpendicular to and over the active regions 2 with a predetermined interval between them. In this case, two word lines 4 cross each active region 2. The active regions 2 are selectively implanted with impurity ions of low concentration by using the word lines 4 as a mask, forming LDD impurity regions. Both sides of each word line 4 are covered with insulating sidewalls 6, which serve as the mask to implant impurity ions of high concentration into the active regions to form source/drain impurity regions.

Figure 1B:
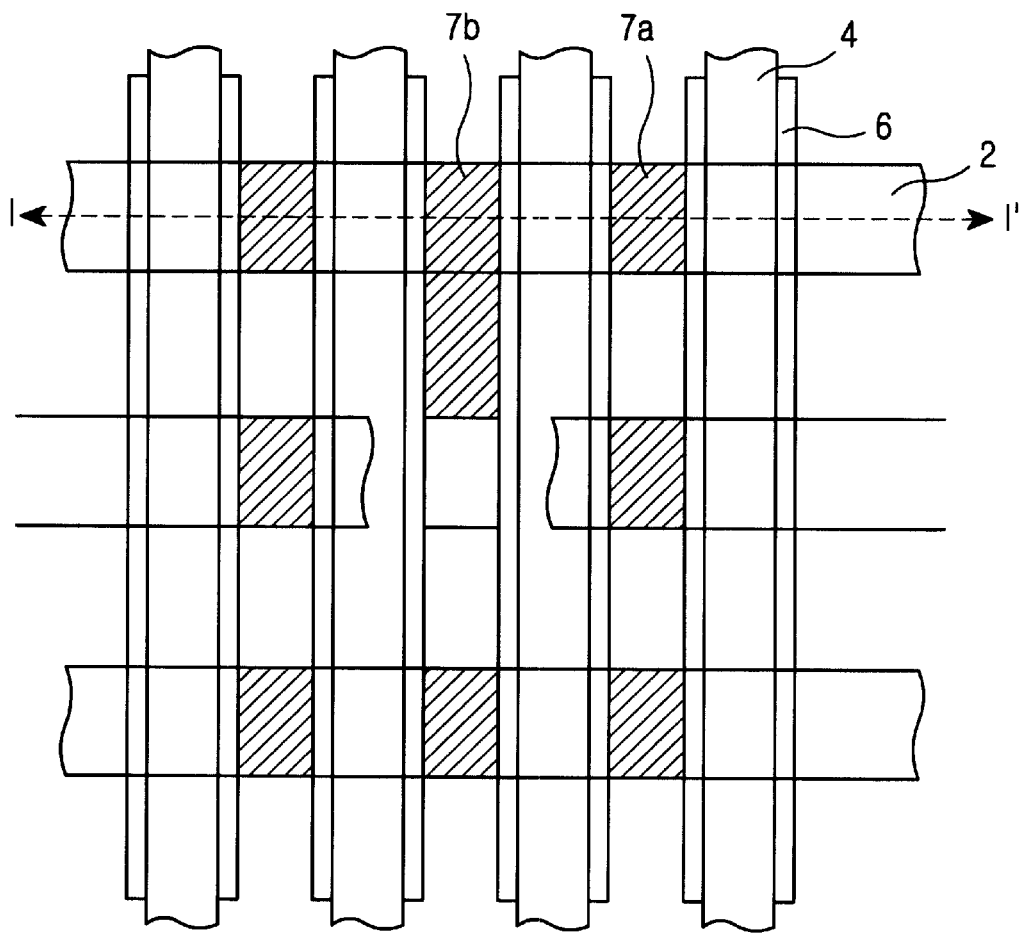
Figure 3B:
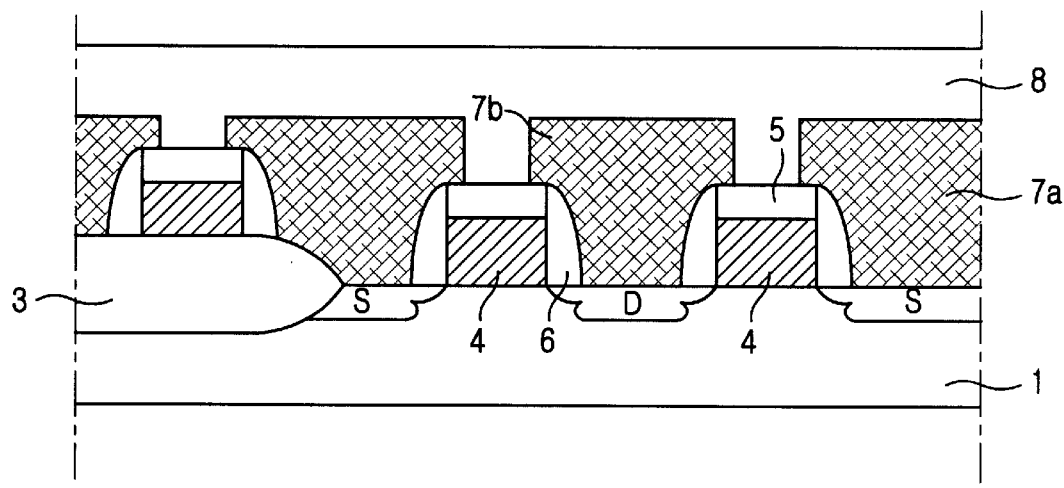

Referring to FIGS. 1B and 3B, deposited over the semiconductor substrate 1 is a first polysilicon layer, which is patterned by photolithographic process to expose the cap insulating layer 6 and to form a plurality of plugs 7a, 7b over the active regions 2 between the word lines 4. The plug 7b is extended to the region to form the bit line for two cells to commonly occupy a single contact, as shown in FIG. 1B. In addition, a first interlayer dielectric (ILD) 8 is heavily deposited over the plugs 7a, 7b, and flattened or planarized by CMP process.

Figure 1C:
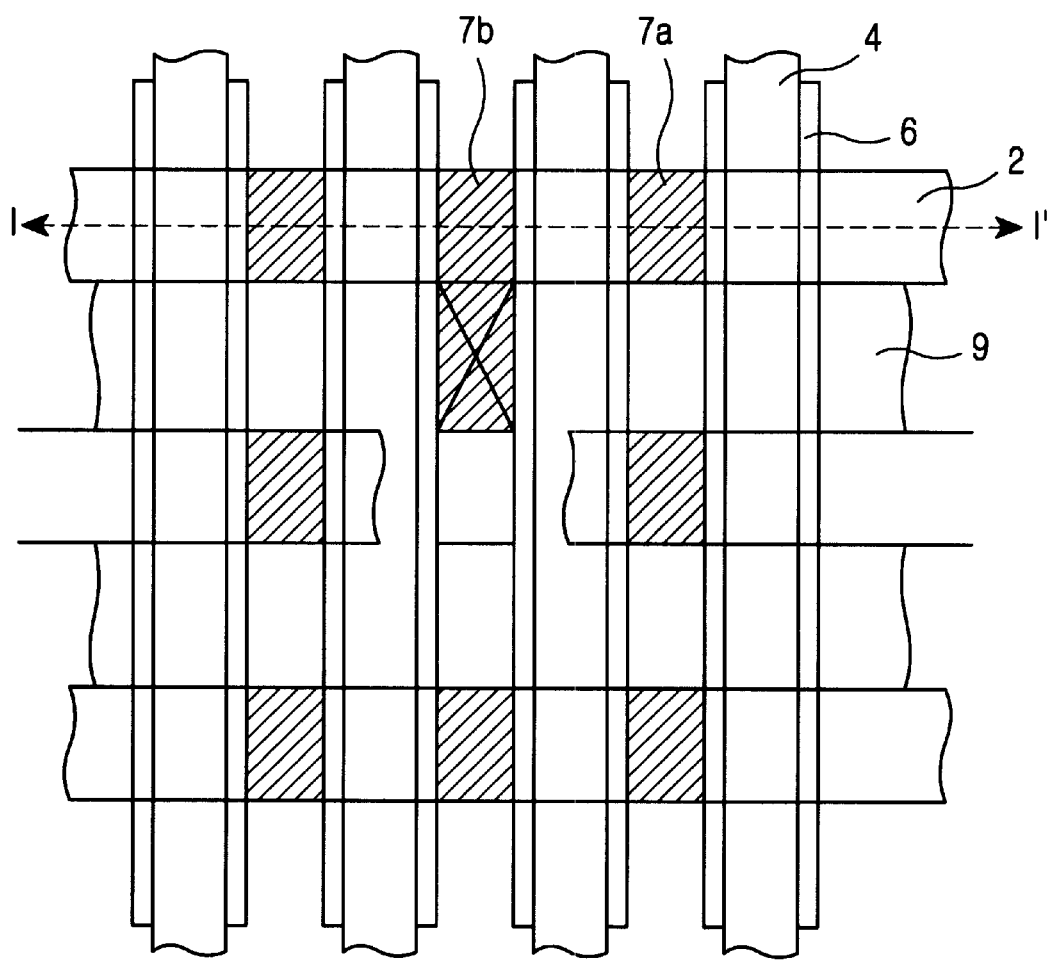
Figure 3C:
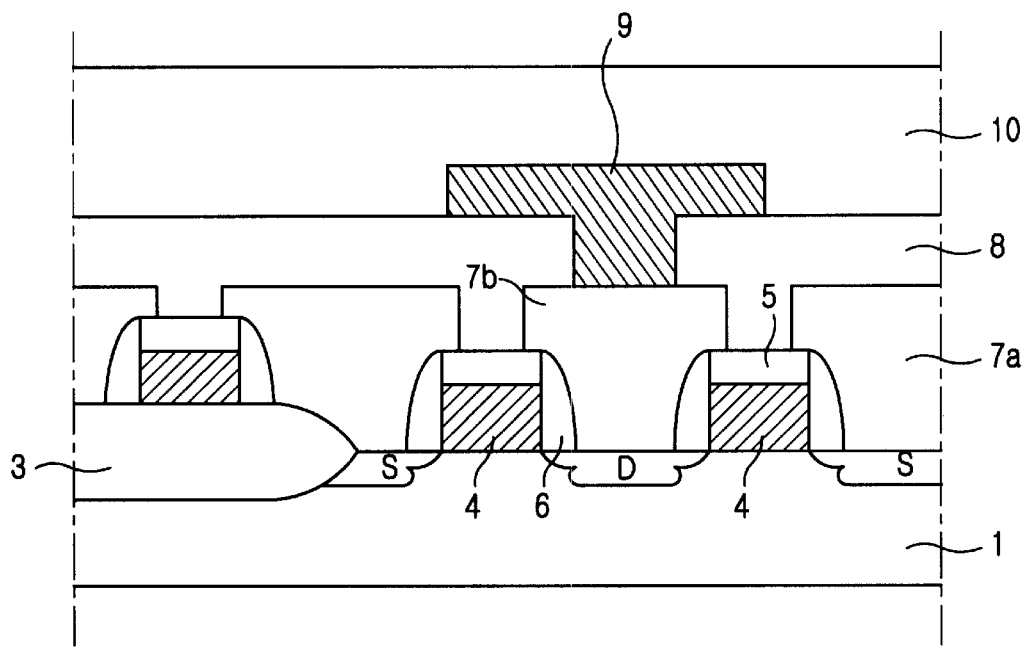

Referring now to FIGS. 1C and 3C, after forming a bit line contact hole in the plug 7b extended to the bit line, tungsten and cap insulating layers are deposited over the substrate including the bit line contact hole, patterned by photolithographic process to form bit line 9 and cap insulating layer (not shown in the drawing) in a direction perpendicular to the word line 4. Then, a second insulating interlayer 10 is formed over the substrate including the bit line 9, and then flattened or planarized.

Figure 1D:
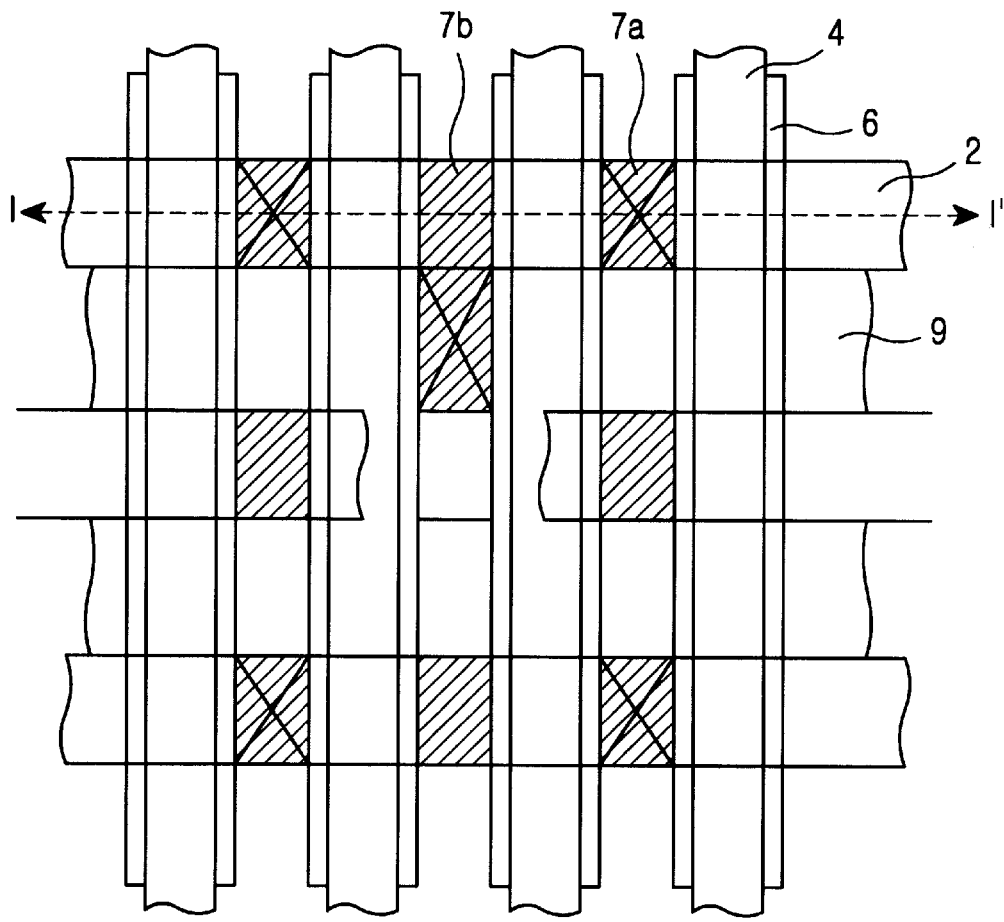
Figure 1E:
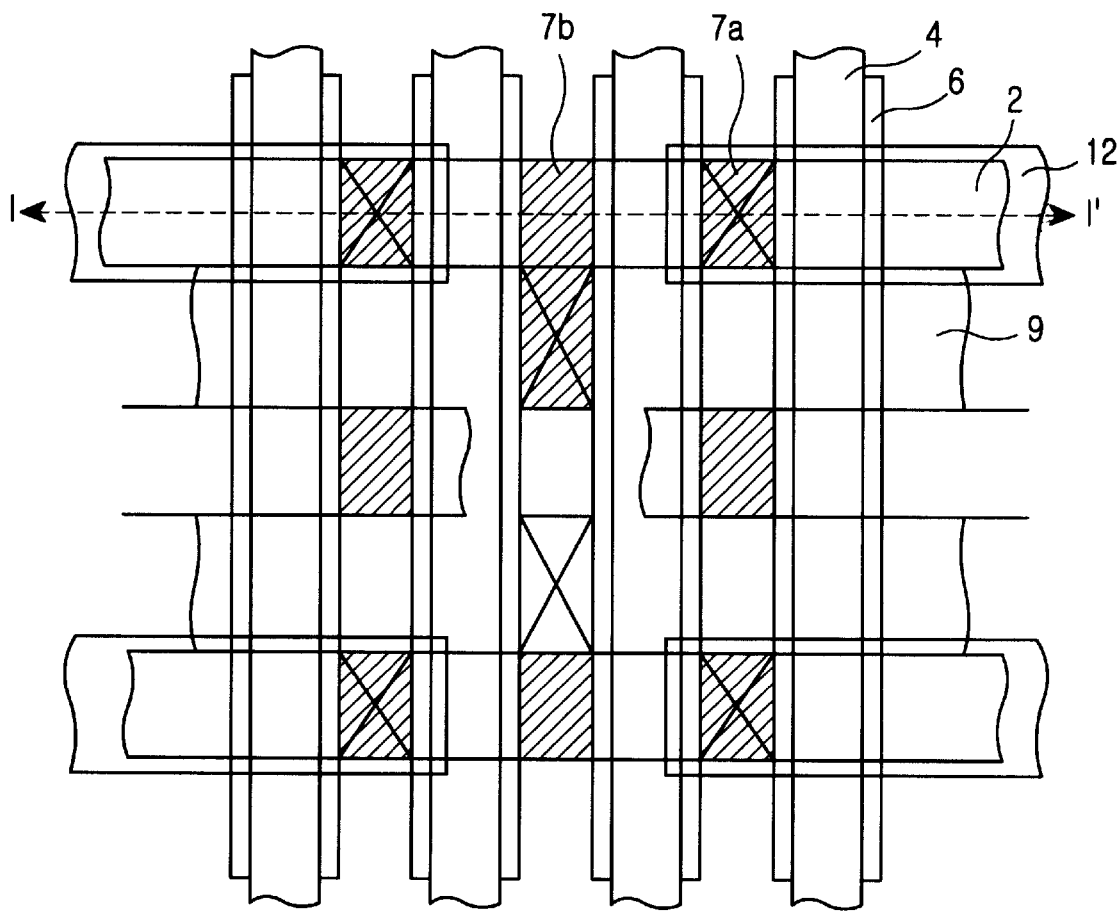
Figure 2A:
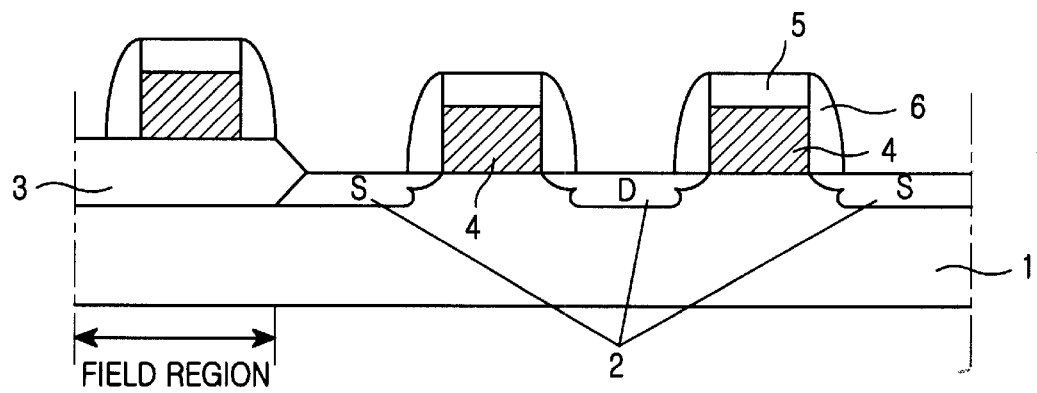
FIGS. 2A to 2F are cross-sectional views taken along line I–I' of FIGS. 1A to 1E for illustrating a conventional method for fabricating a semiconductor device.
Figure 2B:
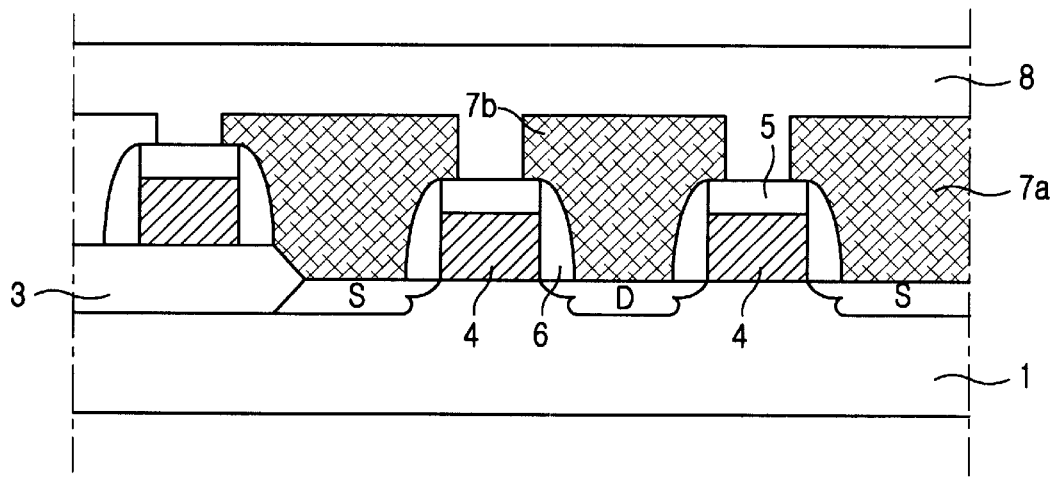
Figure 2C:
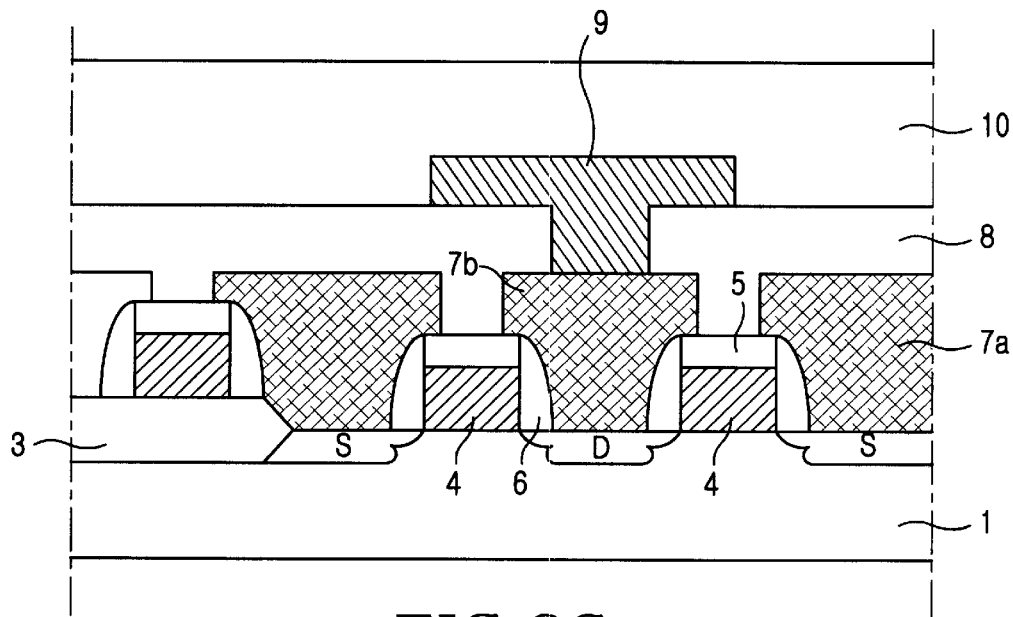
Figure 2D:
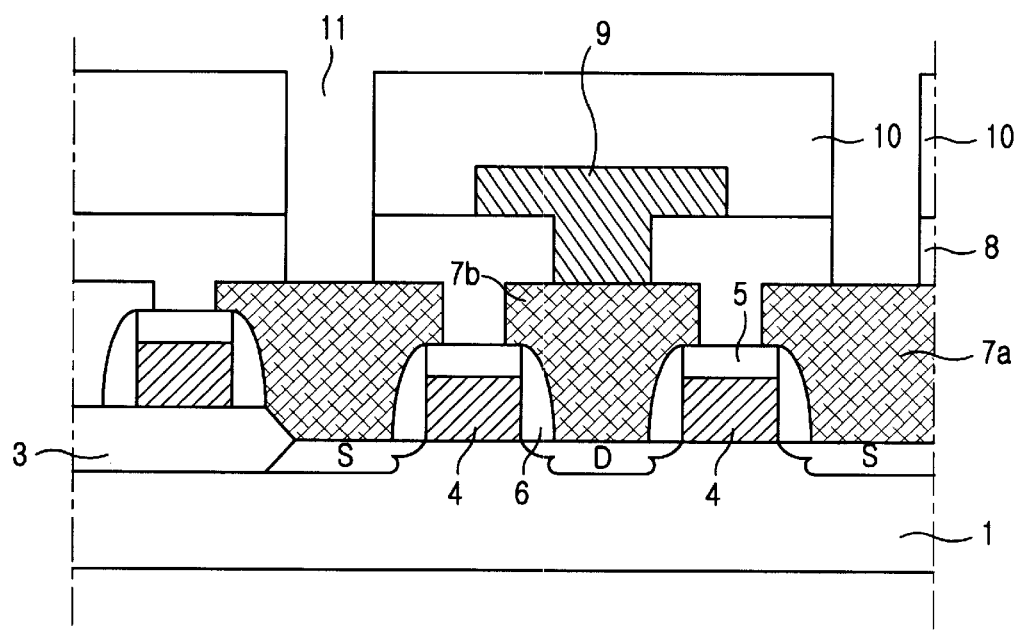
Figure 2E:
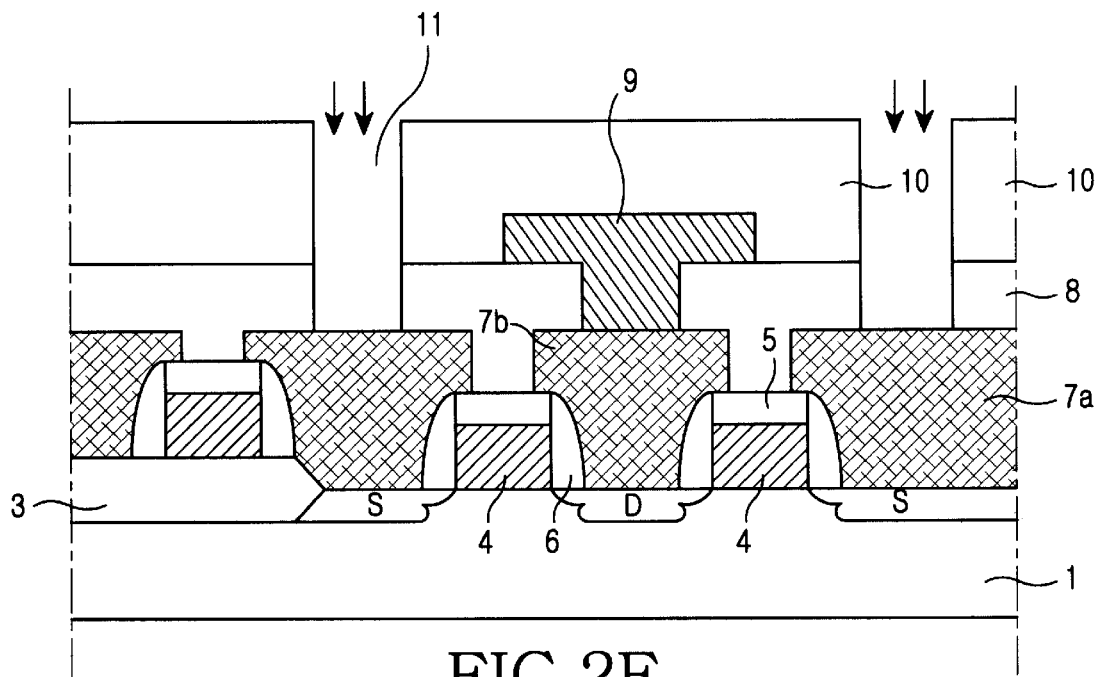
Figure 2F:
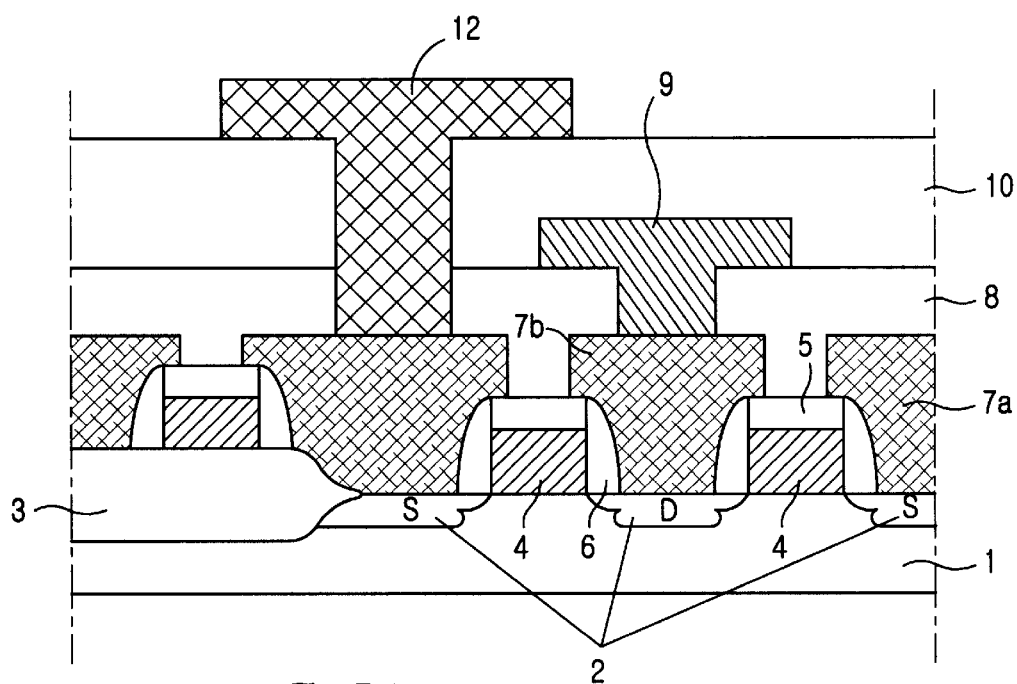
Figure 3D:
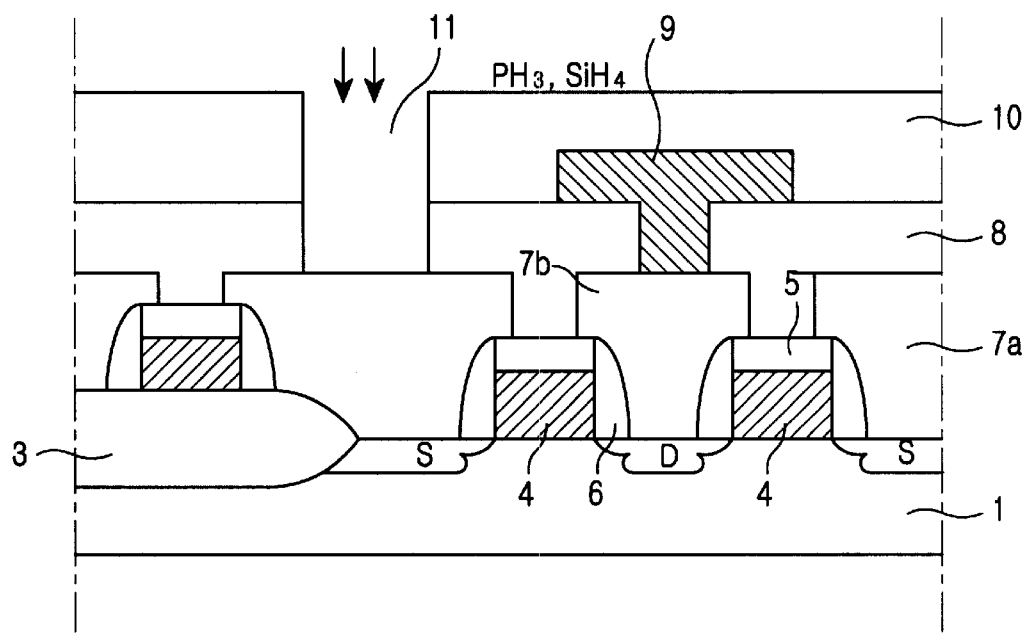
Figure 3E:
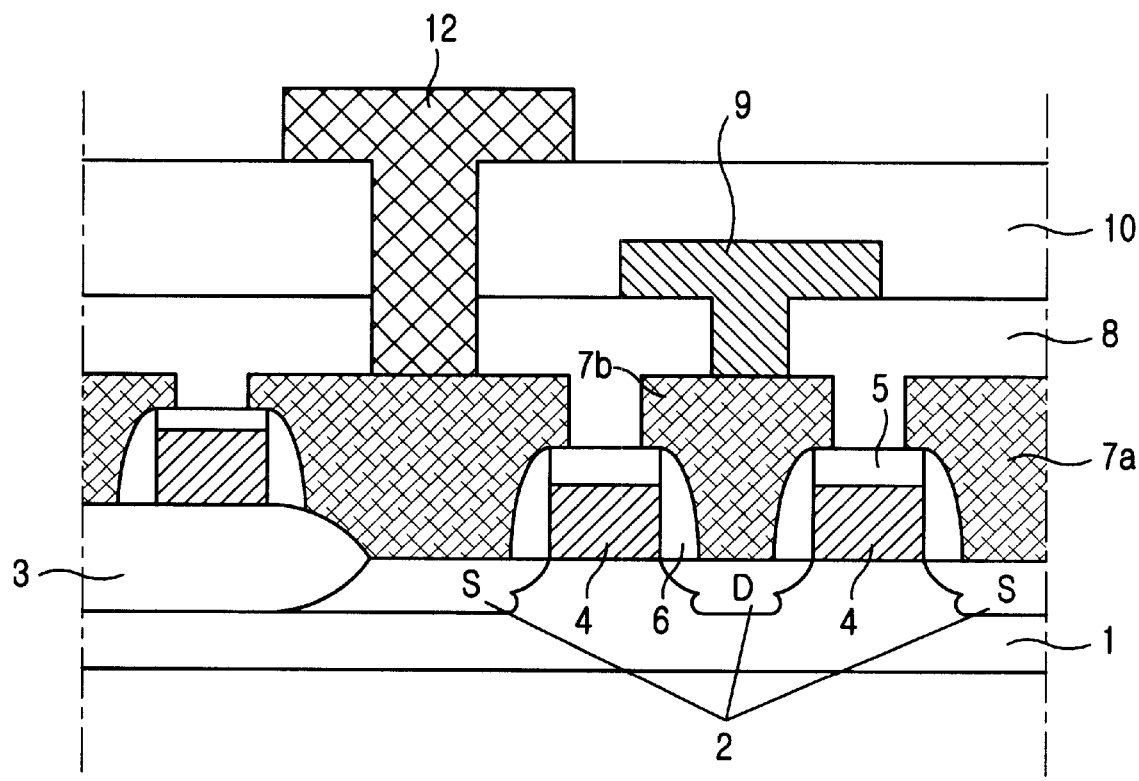

Subsequently, a photoresist (not shown in the drawing) is deposited over the second insulating interlayer 10, photographically patterned to form first contact holes 11 by etching the first and second insulating interlayer 8 and 10 and bit lines 9, as shown in FIGS. 1D and 3D. Then, the substrate is subjected to a heat treatment in an environment of $PH_3$ at a temperature of between about 500 to 800° C. from about 10 to 14 minutes, so that the $PH_3$ gas may be injected into the first contact holes 11 to highly dope the surface of the plugs 7a to connect to the storage electrodes, reducing the contact resistance. Alternatively, the heat treatment may be performed in an environment of $H_2$ and HCL at a temperature of between about 500 to 1000° C. for from about 10 to 14 minutes, and a mixture of $PH_3$ and $SiH_4$ gases are injected into the first contact holes. In this case, the spontaneous oxide layers react with $H_2$ and HCL, transformed into $SiH_2$ and $SiH_4$ gases, and eliminated. Finally, deposited over the second insulating interlayer 10 including the first contact holes 11 is a second polysilicon layer, selectively patterned to form the storage electrodes 12 held by the second insulating interlayer 10 over the active regions 2, as shown in FIGS. 1E and 3E.

Figure 4A:
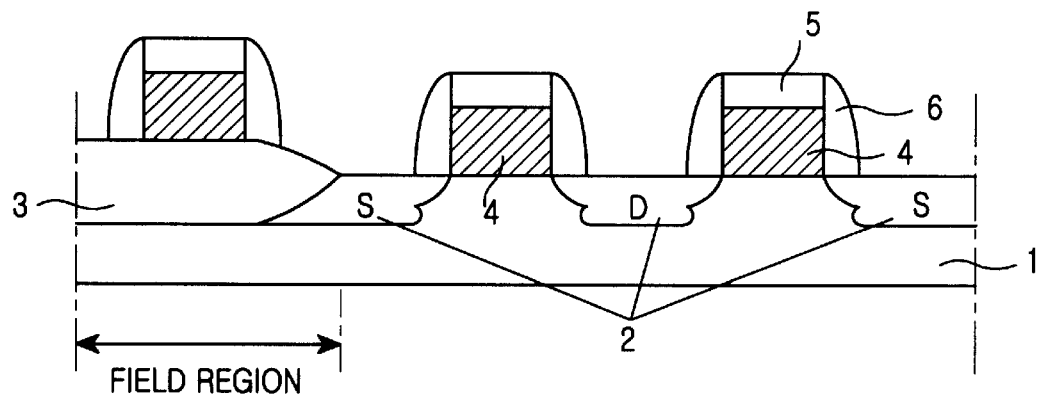

Referring now to FIGS. 4A to 4E, another embodiment of the present invention will be described. A semiconductor substrate 1 is firstly divided into active regions 2 and field regions, as shown in FIG. 4A. The field region is provided with a field oxide layer 3. A plurality of word lines 4 (gate electrodes) with the cap-insulating layers 5 are laid perpendicular to and over the active regions 2 with a predetermined interval between them. The active regions 2 are selectively implanted with impurity ions of low concentration by using the word lines 4 as a mask, forming LDD impurity regions. In this case, two word lines 4 cross each active region 2. Both sides of each word line 4 are covered with insulating sidewalls 6 by an etch-back process, which serve as the mask to implant impurity ions of high concentration into the active regions to form source/drain impurity regions.

Figure 4B:
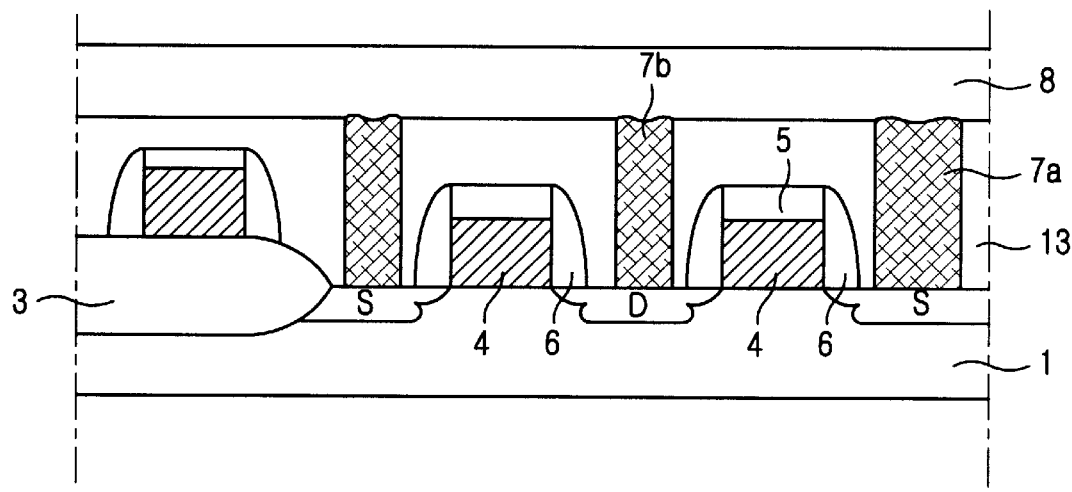

Then, deposited over the substrate 1 including the word lines 4 is a third insulating interlayer 13, which is selectively etched by photolithographic process to form second contact holes exposing the impurity regions, as shown in FIG. 4B. A first polysilicon layer is deposited over the third insulating interlayer 13 including the second contact holes to form a plurality of plugs 7a, 7b, which is then heavily covered by the first insulating interlayer 8, and then flattened or planarized by a CMP process. In this case, the first polysilicon layer deposited over the third insulating interlayer is subjected to the etch-back process to form the plugs 7a, 7b in the second contact holes. The plug 7b is extended to the region to form the bit line.

Figure 4C:
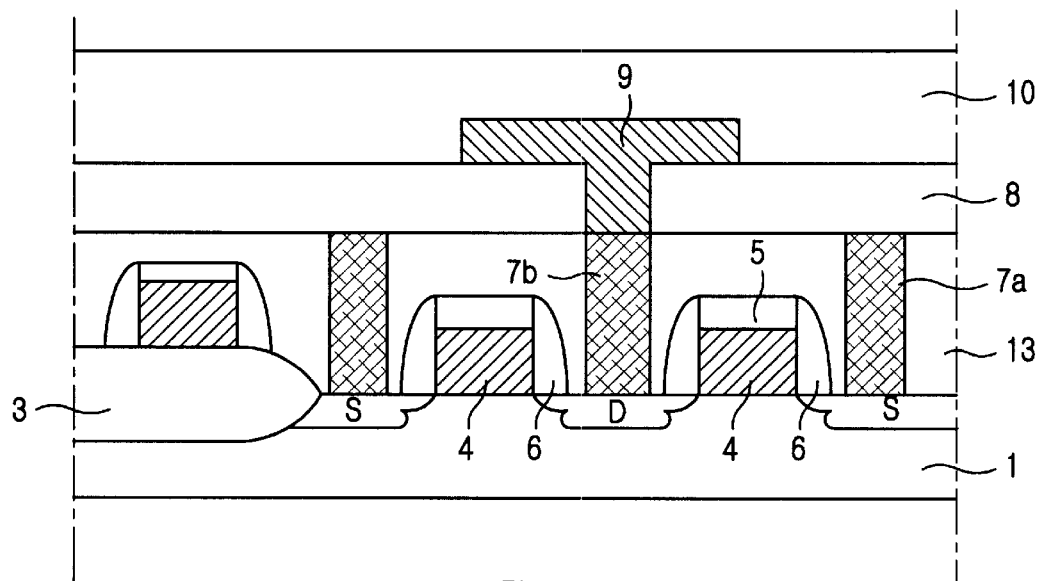

The bit line contact hole is formed in the plug 7b extended to the bit line, over which are deposited tungsten and cap insulating layers, as shown in FIG. 4C. The tungsten layer is patterned by photolithographic process to form a plurality of bit lines 9 with cap insulating layers (not shown), arranged perpendicular to the word lines 4 with a predetermined interval between adjacent bit lines. Then, deposited over the substrate including the bit lines 9 is a second insulating interlayer 10.

Figure 4D:
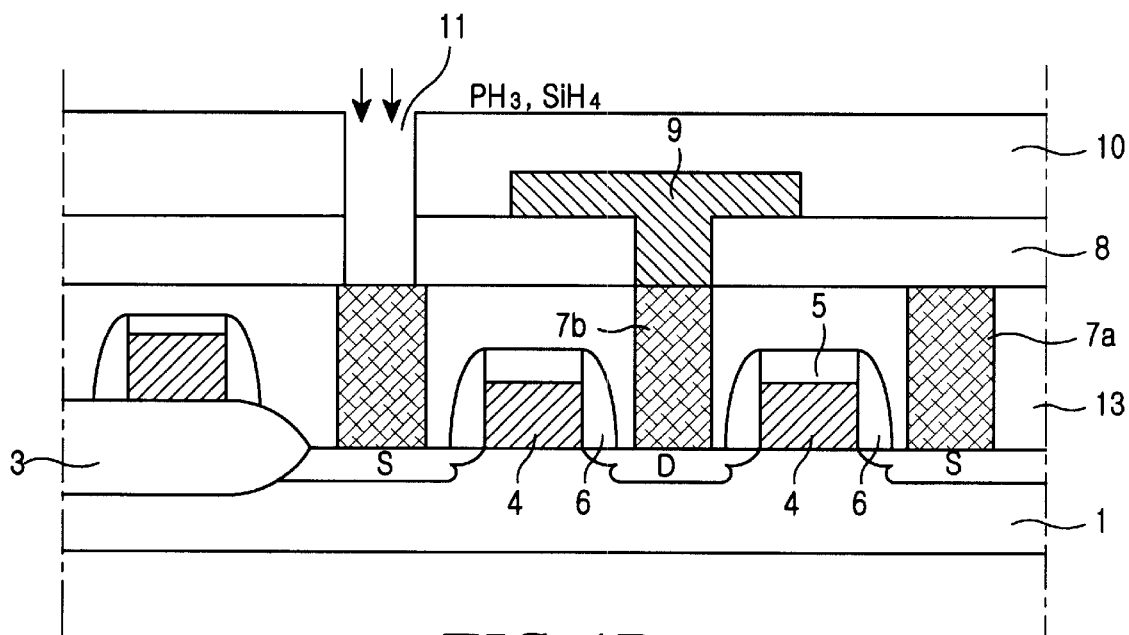
Figure 4E:
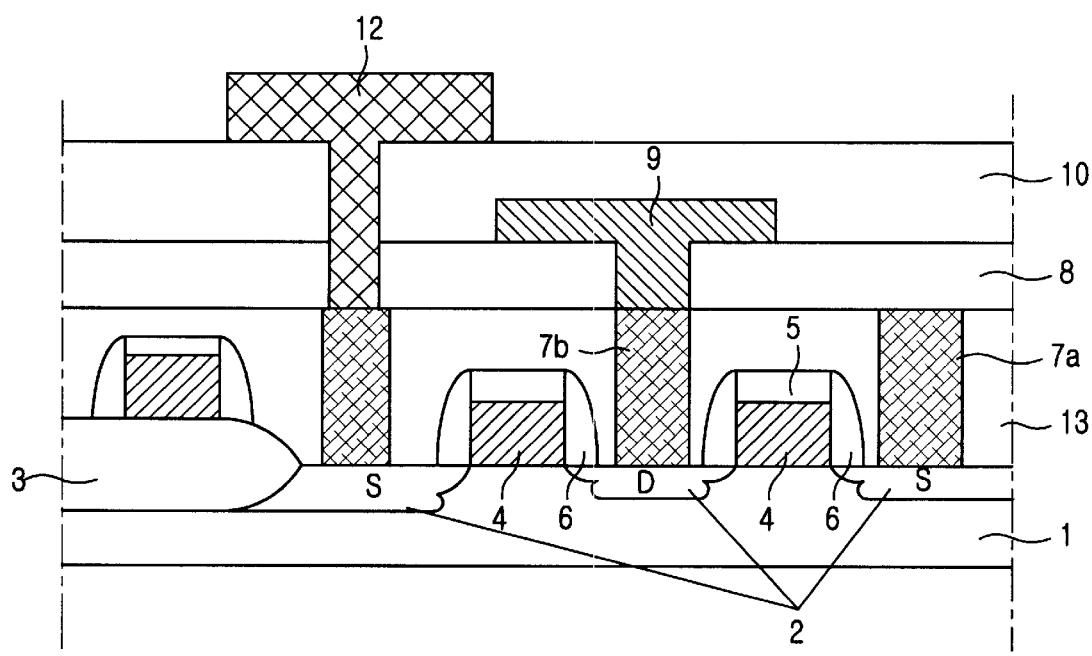

Referring to FIG. 4D, a photoresist (not shown) is deposited over the second insulating interlayer 10, patterned to selectively etch the first and second insulating interlayers 8 and 10 and bit lines 9 to form the first contact holes 11. Thereafter, the substrate is subjected to a heat treatment at 500 to 800° C. from about 10 to 14 minutes. Thereafter, $PH_3$ gas is injected into the first contact holes 11 to highly dope the surface of the plugs 7a to form the storage electrodes, thereby reducing the contact resistance. Alternatively, the heat treatment may be performed in an environment of $H_2$ and HCL at a temperature of between about 500 to 1000° C. from about 10 to 14 minutes, and $PH_3$ gas is injected into the first contact holes. In this case, the spontaneous oxide layers react with $H_2$ and HCL, transformed into $SiH_2$ and $SiH_4$ gases, and eliminated. This reduces the contact resistance. Finally, deposited over the second insulating interlayer 10 including the first contact holes 11 is a second polysilicon layer, selectively patterned to form the storage electrodes 12 held by the second insulating interlayer 10 over the active regions 2, as shown in FIG. 4E.

Figure 5A:
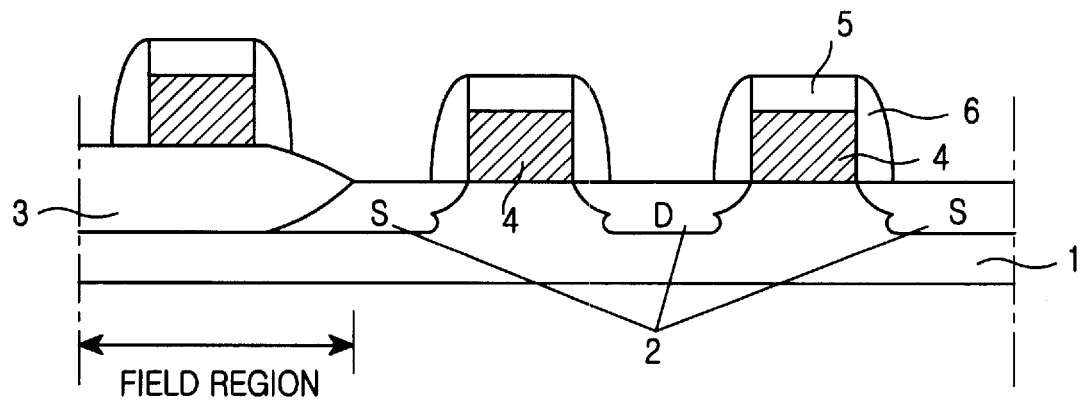
Figure 5B:
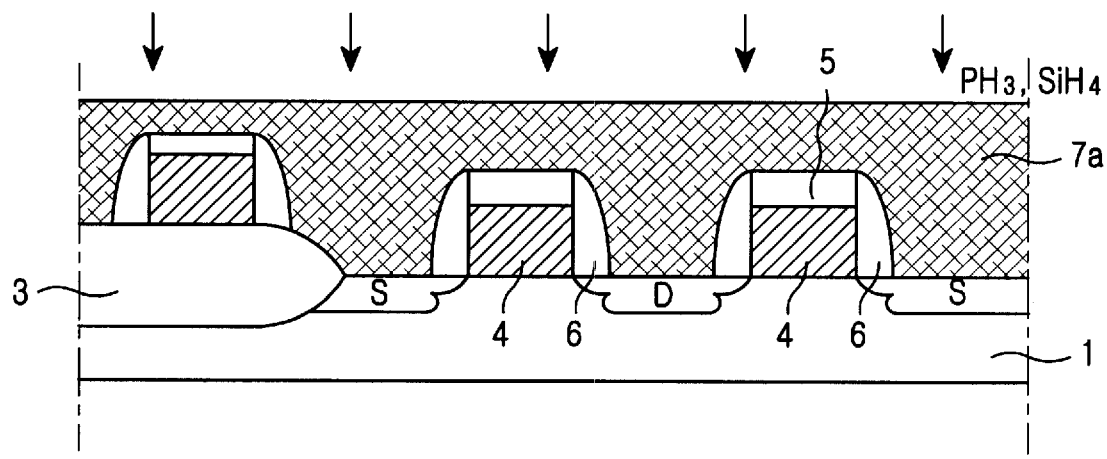
Figure 5C:
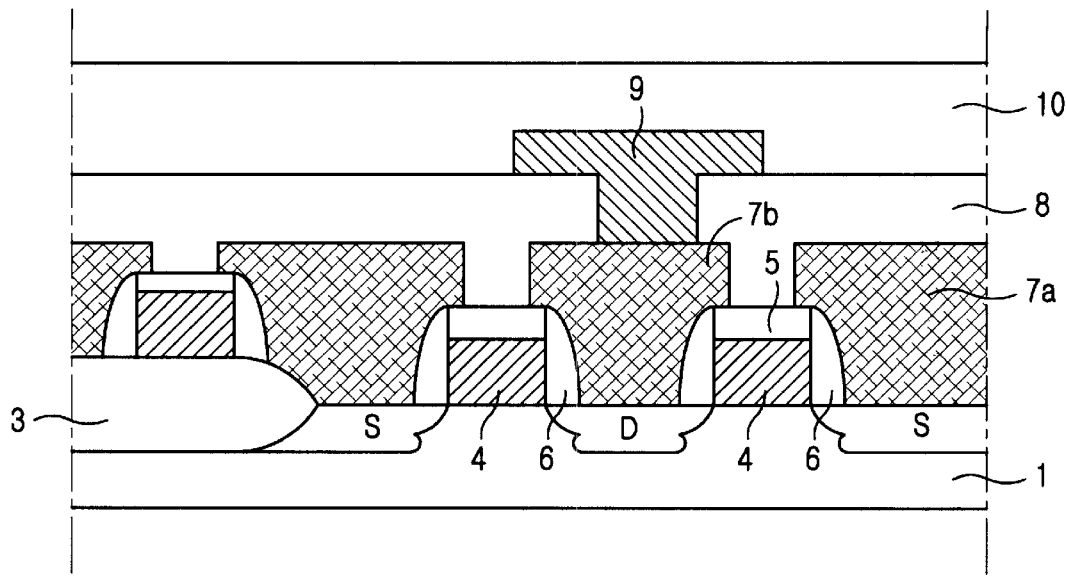

Referring to FIGS. 5A to 5E, yet another embodiment will be described. A semiconductor substrate 1 is divided into active regions 2 and field regions, as shown in FIG. 5A. The field region is provided with the field oxide layer 3. A plurality of word lines 4 (gate electrodes) with the capinsulating layers 5 are laid perpendicular to and over the active regions 2 with a predetermined interval between adjacent word lines. The active regions 2 are selectively implanted with impurity ions of low concentration by using the word lines 4 as a mask, forming LDD impurity regions. In this case, two word lines 4 cross each active region 2. Both sides of each word line 4 are covered with insulating sidewalls 6 by an etch-back process, which serve as the mask to implant impurity ions of high concentration into the active regions to form source/drain impurity regions.

Then, deposited over the substrate 1 including the word lines 4 is a first polysilicon layer 7, which is subjected to a heat treatment in an environment of $PH_3$ at between about 500 to 800° C. from about 10 to 14 minutes together with injecting a mixture of $PH_3$ and $SiH_4$ gases. This makes the surfaces of the plugs subsequently formed high doped so as to reduce the etching loss as well as the contact resistance.

Figure 5D:
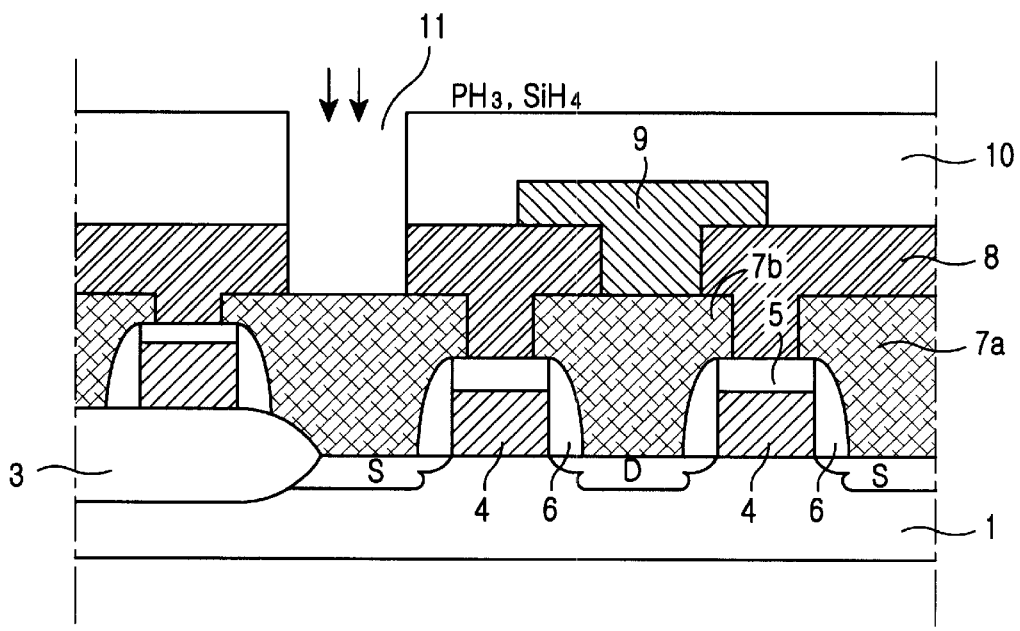
Figure 5E:
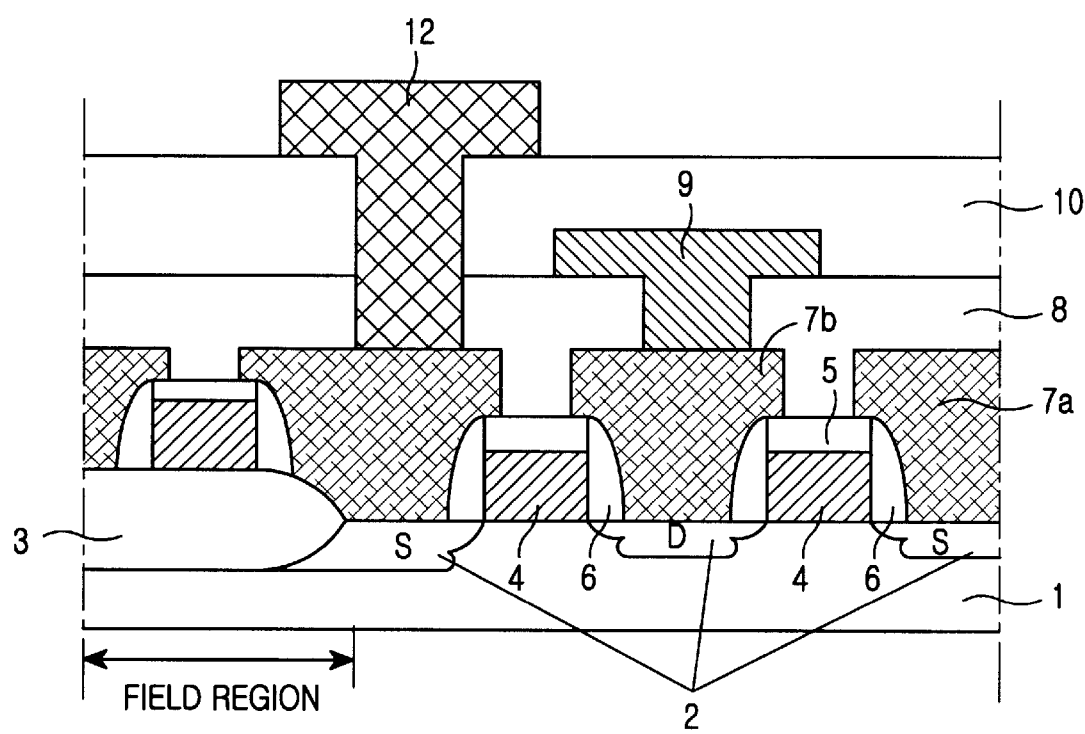

Referring to FIG. 5E, a photoresist is deposited over the first polysilicon layer, patterned by photolithographic process to selectively etch the first polysilicon layer to form a plurality of plugs 7a, 7b over the active regions 2 between the word lines 4. The plug 7b is extended to the region to form the bit line. After removing the photoresist, a first interlayer dielectric (ILD) 8 is heavily deposited over the plugs 7a, 7b, and then flattened or planarized. The bit line contact hole is formed in the plug 7b extended to the bit line, over which are deposited tungsten and cap insulating layers. The tungsten layer is patterned by photolithographic process to form a plurality of bit lines 9 with cap insulating layers (not shown), arranged perpendicular to the word lines 4 with a predetermined interval between adjacent bit lines. Then, deposited over the substrate including the bit lines 9 is a second insulating interlayer 10.

Referring to FIG. 5D, a photoresist (not shown) is deposited over the second insulating interlayer 10, patterned to selectively etch the first and second insulating interlayers 8 and 10 and bit lines 9 to form the first contact holes 11. Thereafter, the substrate is subjected to a heat treatment in an environment of $PH_3$ at between about 500 to 800° C. from about 10 to 14 minutes, and then, $PH_3$ gas is injected into the first contact holes 11 to highly dope the surface of the plugs 7a to form the storage electrodes, thereby reducing the contact resistance. Alternatively, the heat treatment may be performed in an environment of $H_2$ and HCL at a temperature of between about 500 to 1000° C. from about 10 to 14 minutes, and a mixture of $PH_3$ and $SiH_4$ gases is injected into the first contact holes. In this case, the spontaneous oxide layers react with $H_2$ and HCL, transformed into $SiH_2$ and $SiH_4$ gases, and eliminated. This reduces the contact resistance. Finally, deposited over the second insulating interlayer 10 including the first contact holes 11 is a second polysilicon layer, selectively patterned to form the storage electrodes 12 held by the second insulating interlayer 10 over the active regions 2, as shown in FIG. 5E.

Thus, the inventive method injects $PH_3$ into the surface of the polysilicon when deposited on the substrate to increase its surface concentration, and then a mixture of $PH_3$ and $SiH_4$ gases, so that the surface concentration of the completed polysilicon layer may be enhanced to reduce the contact resistance without any additional process, as compared to the conventional method that deposits the polysilicon with a concentration of $1e^{21}/cm^3$ or more together with implanting plug ions to increase its surface concentration. Hence, the elimination of the additional process reduces the processing time which prevents the spontaneous generation of an oxide layer on the surface of the polysilicon layer, thereby reducing the contact resistance. Moreover, $H_2$ and HCL gases used for silicon epitaxial growth also remove the oxide layer spontaneously generated on the surface of the polysilicon layer. While the present invention has been described in connection with specific embodiments accompanied by the attached drawings, it will be readily apparent to those skilled in the art that various changes and modifications may be made thereto without departing from the scope of the present invention.

What is claimed is:

1. A method for fabricating a semiconductor device in a semiconductor substrate divided into active and field regions, comprising the steps of:

forming a plurality of word lines each having a cap insulating layer with a predetermined interval between adjacent word lines on the substrate;

forming source/drain impurity regions in the active regions adjacent to both sides of each of the word lines;

forming insulating sidewalls on both sides of each of the word lines;

forming capacitor node plugs and bit line contact plugs on the source/drain impurity regions;

forming a plurality of bit lines in a direction perpendicular to the word lines with a predetermined interval between adjacent bit lines by forming bit line contact holes contacting the bit line contact plugs in a first insulating interlayer deposited on the substrate;

forming storage electrode contact holes to expose the capacitor node plugs in a second insulating interlayer deposited over the substrate;

subjecting the storage electrode contact holes to a heat treatment in a first impurity containing gaseous environment, and then injecting a second impurity containing gas into the contact holes to highly dope and/or etch spontaneous oxide from the surface of the capacitor node plugs; and a second polysilicon layer, selectively patterned to form storage electrodes deposited over the second insulating interlayer including the contact holes, wherein the concentration of the second polysilicon is greater than $1E21/cm^3$.

2. A method as defined in claim 1, wherein the heat treatment is performed in an environment of $PH_3$ at a temperature of between about 500° C. and 800° C.

3. A method as defined in claim 1, wherein the heat treatment is performed in an environment of $H_2$ and HCL at a temperature of between about 500° C. and 1000° C. from about 10 to 14 minutes.

4. A method as defined in claim 1, wherein the injected second impurity containing gas is a mixture of $PH_3$ and $SiH_4$.

5. A method as defined in claim 1, wherein the step of forming the capacitor node plugs and bit line contact plugs further includes the steps of:

forming a photoresist pattern on a polysilicon layer deposited on the substrate; and using the photoresist pattern as a mask to form the capacitor node plugs and bit line contact plugs.

6. A method as defined in claim 1, wherein the step of forming the capacitor node plugs and bit line contact plugs further includes the steps of:

forming a third insulating interlayer on the substrate and exposing predetermined parts of the impurity regions; and forming the capacitor node plugs and bit line contact plugs on the impurity regions by using CMP (chemical mechanical polishing).

7. A method as defined in claim 6, wherein the capacitor node plugs and the bit line contact plugs are formed by an etch-back process.

8. A method as defined in claim 1, wherein the capacitor node lugs, bit line contact plugs and storage electrodes consist of polysilicon.

9. A method for fabricating a semiconductor device in a semiconductor substrate divided into active and field regions, the field regions being provided with field oxide layers, comprising the steps of:

forming a plurality of word lines each having a cap insulating layer with a predetermined interval between adjacent word lines on the substrate;

forming source/drain impurity regions in the active regions adjacent to both sides of each of the word lines;

forming insulating sidewalls on both sides of each of the word lines;

forming capacitor node plugs and bit line contact plugs between the word lines and active regions after implanting impurity ions into a conductive layer deposited on the substrate including the word lines;

forming a plurality of bit lines in the direction perpendicular to the word lines with a predetermined interval between adjacent bit lines by forming bit line contact holes contacting the bit line contact plugs in a first insulating interlayer deposited on the substrate;

forming storage electrode contact holes to expose the capacitor node plugs in a second insulating interlayer deposited over the substrate;

subjecting the storage electrode contact holes to heat treatment in a first impurity containing gaseous environment, and then injecting a second impurity containing gas into the contact holes to highly dope and/or etch spontaneous oxide from the surface of the capacitor node plugs; and a second polysilicon layer, selectively patterned to form storage electrodes deposited over the second insulating interlayer including the contact holes, wherein the concentration of the second polysilicon is greater than $1E21/cm^3$.

10. A method as defined in claim 9, wherein the heat treatment is performed in an environment of $PH_3$ at a temperature of between about 500° C. and 800° C.

11. A method as defined in claim 9, wherein the heat treatment is performed in an environment of $H_2$ and HCL at a temperature of between about 500° C. and 1000° C. from about 10 to 14 minutes.

12. A method as defined in claim 9, wherein the injected second impurity containing gas is a mixture of $PH_3$ and $SiH_4$.

13. A method as defined in claim 9, wherein the capacitor node plugs, bit line contact plugs and storage electrodes consist of polysilicon.

* * * * *